United States Patent
Duduman et al.

(10) Patent No.: US 9,774,322 B1
(45) Date of Patent: Sep. 26, 2017

(54) GATE DRIVER FOR DEPLETION-MODE TRANSISTORS

(71) Applicant: Sarda Technologies, Inc., Durham, NC (US)

(72) Inventors: Bogdan M. Duduman, Raleigh, NC (US); Anthony G. P. Marini, Clinton, MA (US); William R. Richards, Jr., Cary, NC (US); William E. Batchelor, Raleigh, NC (US); Greg J. Miller, Cary, NC (US); John K. Fogg, Cary, NC (US)

(73) Assignee: Sarda Technologies, Inc., Durham, NC (US)

( * ) Notice: Subject to any disclaimer, the term of this patent is extended or adjusted under 35 U.S.C. 154(b) by 0 days.

(21) Appl. No.: 15/190,095

(22) Filed: Jun. 22, 2016

(51) Int. Cl.
| | |
|---|---|
| *H03B 1/00* | (2006.01) |
| *H03K 3/00* | (2006.01) |
| *H03K 17/22* | (2006.01) |
| *H03K 7/08* | (2006.01) |
| *H03K 5/19* | (2006.01) |
| *H02M 3/07* | (2006.01) |

(52) U.S. Cl.
CPC ............ *H03K 17/223* (2013.01); *H02M 3/07* (2013.01); *H03K 5/19* (2013.01); *H03K 7/08* (2013.01)

(58) Field of Classification Search
CPC .................................................. H03K 17/223
USPC ....................................................... 327/109
See application file for complete search history.

(56) References Cited

U.S. PATENT DOCUMENTS

| | | | |
|---|---|---|---|
| 4,636,825 | A | 1/1987 | Baynes |
| 5,091,817 | A | 2/1992 | Alley et al. |
| 5,227,781 | A | 7/1993 | Ninnis |
| 5,258,638 | A | 11/1993 | Elhatem et al. |
| 5,289,040 | A | 2/1994 | Rogers |
| 5,298,851 | A | 3/1994 | DeNardis |
| 5,495,165 | A | 2/1996 | Beland |
| 5,714,809 | A | 2/1998 | Clemo |
| 5,721,144 | A | 2/1998 | Hsieh et al. |
| 5,786,685 | A | 7/1998 | Lange et al. |
| 5,789,791 | A | 8/1998 | Bergemont |
| 5,801,091 | A | 9/1998 | Efland et al. |
| 5,815,356 | A | 9/1998 | Rodriguez et al. |
| 5,955,763 | A | 9/1999 | Lin |
| 6,292,046 | B1 | 9/2001 | Ali |
| 6,424,006 | B1 | 7/2002 | Ponse |
| 6,900,482 | B2 | 5/2005 | Aoki et al. |

(Continued)

OTHER PUBLICATIONS

Non-Final Office Action, dated Dec. 31, 2012, U.S. Appl. No. 13/205,433, filed Aug. 8, 2011.

(Continued)

*Primary Examiner* — Lincoln Donovan
*Assistant Examiner* — Metasebia Retebo
(74) *Attorney, Agent, or Firm* — Carr & Ferrell LLP (57) ABSTRACT

The present disclosure presents a circuit, a method, and a system to drive a half-bridge switch using depletion (D) mode compound semiconductor (III-V) switching transistors for a DC-DC converter using at least one driver to drive the switches of the circuit. Also included is at least one charge pump electrically connected to a gate of the transistor, to maintain a voltage that holds the transistor in an off-state. The circuit includes AC coupling capacitors to level shift a voltage and realize fast transistor switching.

18 Claims, 5 Drawing Sheets

(56) References Cited

U.S. PATENT DOCUMENTS

| | | |
|---|---|---|
| 7,132,717 B2 | 11/2006 | Su et al. |
| 7,157,959 B2 | 1/2007 | Ball et al. |
| 7,251,178 B2 | 7/2007 | Gogl et al. |
| 7,313,006 B2 | 12/2007 | Choi |
| 7,560,346 B2 | 7/2009 | Igarashi |
| 7,952,117 B2 | 5/2011 | Masuda |
| 8,008,960 B2 | 8/2011 | Arduini |
| 8,064,179 B2 | 11/2011 | Apfel |
| 8,097,906 B2 | 1/2012 | Takagi |
| 8,203,372 B2 | 6/2012 | Arduini |
| 8,274,121 B2 | 9/2012 | Vorhaus |
| 8,339,055 B2 | 12/2012 | Zhan et al. |
| 8,344,463 B2 | 1/2013 | Yanagihara et al. |
| 8,344,464 B2 | 1/2013 | Cho |
| 8,426,952 B2 | 4/2013 | Cho et al. |
| 8,497,574 B2 | 7/2013 | Cho et al. |
| 8,513,707 B2 | 8/2013 | Herberholz |
| 8,519,916 B2 | 8/2013 | Vorhaus |
| 8,541,271 B1 | 9/2013 | Vorhaus |
| 8,569,811 B1 | 10/2013 | Vorhaus et al. |
| 8,575,621 B1 | 11/2013 | Vorhaus |
| 8,637,909 B1 | 1/2014 | Vorhaus |
| 8,653,565 B1 | 2/2014 | Vorhaus |
| 8,759,924 B1 | 6/2014 | Vorhaus |
| 8,835,239 B1 | 9/2014 | Vorhaus |
| 8,896,034 B1 | 11/2014 | Vorhaus |
| 8,952,424 B2 | 2/2015 | Herberholz |
| 9,006,799 B2 | 4/2015 | Vorhaus |
| 9,136,265 B2 | 9/2015 | Vorhaus |
| 9,236,378 B2 | 1/2016 | Vorhaus |
| 9,252,143 B2 | 2/2016 | Vorhaus |
| 9,536,871 B2 | 1/2017 | Vorhaus |
| 2002/0014670 A1 | 2/2002 | Litwin |
| 2002/0142554 A1 | 10/2002 | Nakajima |
| 2004/0164407 A1 | 8/2004 | Nakajima et al. |
| 2006/0198173 A1* | 9/2006 | Rozman ............... H02M 1/08 363/123 |
| 2007/0200803 A1 | 8/2007 | Kimura |
| 2007/0228424 A1 | 10/2007 | Igarashi |
| 2007/0236424 A1 | 10/2007 | Kimura |
| 2007/0296028 A1* | 12/2007 | Brar ................. H01L 29/47 257/328 |
| 2009/0050900 A1 | 2/2009 | Masuda |
| 2009/0065810 A1 | 3/2009 | Honea et al. |
| 2009/0095989 A1 | 4/2009 | Kim |
| 2010/0171685 A1 | 7/2010 | Kimura |
| 2011/0187283 A1* | 8/2011 | Wang ................. H05B 37/02 315/291 |
| 2012/0032606 A1 | 2/2012 | Fukumoto et al. |
| 2012/0037917 A1 | 2/2012 | Vorhaus |
| 2012/0086497 A1 | 4/2012 | Vorhaus |
| 2012/0099357 A1 | 4/2012 | Morita |
| 2012/0267795 A1 | 10/2012 | Shimura |
| 2013/0043487 A1 | 2/2013 | Liu et al. |
| 2014/0191305 A1 | 7/2014 | Vorhaus |
| 2015/0054091 A1 | 2/2015 | Vorhaus |
| 2015/0171080 A1 | 6/2015 | Vorhaus |
| 2015/0357323 A1 | 12/2015 | Vorhaus |
| 2016/0036330 A1* | 2/2016 | Sturcken ............. H02M 3/1584 323/271 |
| 2016/0086937 A1 | 3/2016 | Vorhaus |

OTHER PUBLICATIONS

Notice of Allowance, dated Jun. 6, 2013, U.S. Appl. No. 13/205,433, filed Aug. 8, 2011.
Non-Final Office Action, dated May 1, 2012, U.S. Appl. No. 13/270,145, filed Oct. 10, 2011.
Notice of Allowance, dated Aug. 2, 2012, U.S. Appl. No. 13/270,145, filed Oct. 10, 2011.
Notice of Allowance, dated Aug. 22, 2013, U.S. Appl. No. 13/364,258, filed Feb. 1, 2012.
Notice of Allowance, dated Sep. 16, 2013, U.S. Appl. No. 13/442,313, filed Apr. 9, 2012.
Non-Final Office Action, dated Apr. 25, 2013, U.S. Appl. No. 13/441,644, filed Apr. 6, 2012.
Notice of Allowance, dated Jul. 5, 2013, U.S. Appl. No. 13/441,644, filed Apr. 6, 2012.
Notice of Allowance, dated Aug. 25, 2014, U.S. Appl. No. 13/449,280, filed Apr. 17, 2012.
Notice of Allowance, dated Oct. 9, 2013, U.S. Appl. No. 13/685,543, filed Nov. 26, 2012.
Non-Final Office Action, dated Apr. 28, 2015, U.S. Appl. No. 14/205,281, filed Mar. 11, 2014.
Notice of Allowance, dated Aug. 26, 2015, U.S. Appl. No. 14/205,281, filed Mar. 11, 2014.
Notice of Allowance, dated Mar. 5, 2014, U.S. Appl. No. 13/908,871, filed Jun. 3, 2013.
Notice of Allowance, dated Aug. 30, 2013, U.S. Appl. No. 13/948,076, filed Jul. 22, 2013.
Notice of Allowance, dated Apr. 29, 2014, U.S. Appl. No. 14/166,795, filed Jan. 28, 2014.
Notice of Allowance, dated Dec. 4, 2014, U.S. Appl. No. 14/453,828, filed Nov. 4, 2014.
Notice of Allowance, dated Jun. 22, 2015, U.S. Appl. No. 14/628,214, filed Feb. 21, 2015.
Notice of Allowance, dated Sep. 23, 2015, U.S. Appl. No. 14/827,240, filed Aug. 14, 2015.

* cited by examiner

GATE DRIVER FOR DEPLETION-MODE TRANSISTORS

FIELD OF THE INVENTION

The present invention relates to semiconductor devices, and more specifically to gate driver circuits for depletion-mode Field Effect Transistors (FETs).

BACKGROUND

Figure 1A:
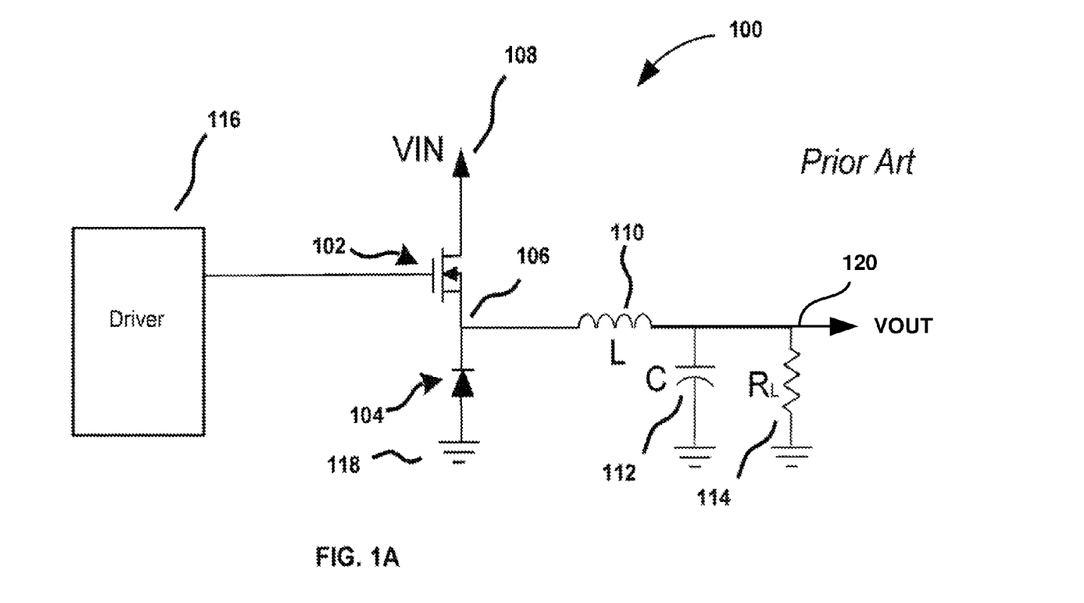
FIG. 1A illustrates an exemplary standard DC-DC converter power stage and output filter circuit.

A DC-DC converter circuit is a type of switching circuit that regulates an output voltage from a given input voltage. The circuit may step-up (e.g. Boost converter) or step-down (e.g. Buck converter) the voltage. Switching circuits come in two varieties, standard and synchronous. FIG. 1A illustrates a prior art standard Buck DC-DC converter circuit 100. Standard Buck converters use a control switching transistor 102 to regulate voltage and current flow in the upper side, while a diode 104 is used for the lower side of the circuit. A periodic signal, such as a Pulse Width Modulated (PWM) signal exhibiting a duty cycle (D), allows control and regulation of the output voltage by exercising the control switch in accordance with the duty cycle of the PWM signal. The duty cycle represents the fraction of a switching period during which the control switching transistor 102 is turned on. The output voltage (VOUT) 120 is directly proportional to the product of the input voltage (VIN) 108 and the duty cycle (D). A driver 116 alternately switches the upper-side transistor 102 on and off in step with the PWM signal, thereby regulating the time-averaged voltage at the switching node 106. A forward biased diode 104, facilitates the continuous flow of inductor current when the control transistor 102 is switched off. The diode 104 is customarily referred to as a "freewheeling diode", since it circulates positive output inductor 110 current flow (flowing toward VOUT 120) while the control switching transistor 102 is in an off state. The combination of the transistor 102 and diode 104, in response to the PWM signal, operate to regulate the voltage level VOUT 120 across the load, $R_L$ 114. A voltage source provides input voltage at VIN 108. The switching node 106 between the control switch 102 and the freewheeling diode 104 is connected to the converter's output through a low-pass filter comprising an inductor 110 and an output capacitor 112. VOUT 120 is referenced to ground 118.

Figure 1B:
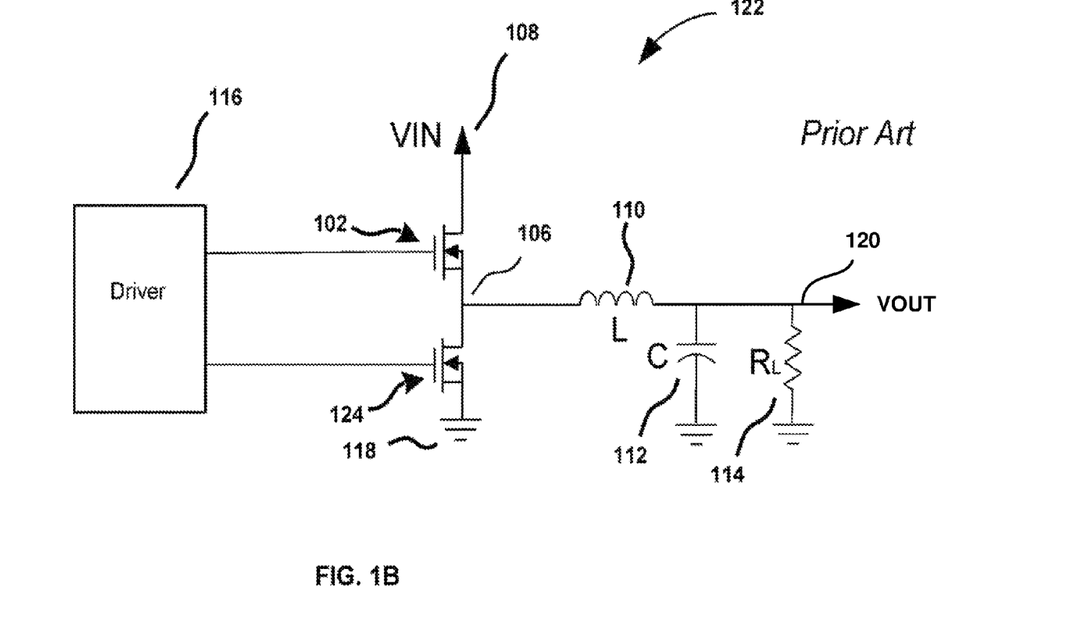
FIG. 1B illustrates an exemplary synchronous DC-DC converter power stage and output filter circuit.

FIG. 1B illustrates a prior art synchronous DC-DC converter circuit 122. This type of converter circuit 122 uses a half-bridge switch configuration, and therefore has two switching transistors, which are known as the upper-side (or control) transistor 102 and the lower-side (or synchronous) transistor 124. The two transistors are actively controlled to alternately switch on and off out of phase with each other, regulating the output voltage VOUT 120. A voltage source provides input voltage at VIN 108. The switching node 106 between the two devices is connected to the converter's output through a low-pass filter comprising an output inductor 110 and an output capacitor 112. VOUT 120 is referenced to ground 118. A driver 116 provides on/off control for the switching transistors 102 and 124, in response to a periodic control signal such as a PWM signal.

The transistor switches can be fabricated as either enhancement-mode (E-mode) devices, which are off-state at zero applied gate bias, or depletion-mode (D-mode) devices, which are on-state at zero applied gate bias.

Silicon (Si) based voltage converters typically use enhancement mode MOSFETs for the transistor switches 102, and 124, and for drivers. A Gallium-Arsenide (GaAs) depletion mode power FET transistor is also a 3-terminal device. There is a channel running between drain (D) and source (S), whose conduction is controlled by the gate (G) potential. The gate-to-source (or gate-to-drain) junction V-I characteristics resemble very much that of a diode junction, ranging from a Schottky to a high-threshold P-N diode. A N-channel depletion mode FET has a negative threshold for D-S conduction and is on when no voltage is applied to the gate, turning off when a bias more negative than its threshold is applied G-S. As the G-S bias increases above the threshold voltage, the D-S channel resistance decreases in proportion to the increase in bias differential. G-S bias is ultimately limited in the positive domain by the forward biasing of the G-S junction.

Compound semiconductors, such as GaAs III-V materials, offer high frequency transistor switching capabilities, however, their G-S control junctions (some resembling Schottky junctions) can be leakier than doped P-N silicon counterparts. Engineering the control circuits to manage the junction leakage issue in the absence of existing negative bias supplies, is substantially more difficult. Also, synchronous converter circuits built using all D-mode switching transistors may conduct current in an uncontrolled and potentially wasteful and/or damaging fashion upon system start-up, before the control electronics can apply nominal voltages to the transistor gate electrodes.

The need for additional circuit components, design complexity and the normally inexistent negative bias supplies in typical applications has deterred prior commercialization of D-mode gate drivers.

SUMMARY

In various embodiments a driver circuit is described that includes at least one gate drive circuit to control a depletion mode switching transistor. Also included is at least one charge pump electrically connected to a gate of the transistor, to maintain a voltage that holds the transistor in an off-state. At least one coupling capacitor is electrically connected between the output of each of the gate drive circuits and a gate of the transistor, to shift a gate voltage that alternately drives the transistor into an on-state and an off-state.

Also included is a method for driving a depletion-mode transistor in a DC-DC converter. The method steps include initializing a signal to begin a startup condition, switching a power isolating switch to an on-state, and initiating at least one command to control a driver circuit to pass an external controller-generated PWM control signal to a gate of the switching transistor. The control signal alternately drives the switching transistor to an on-state and an off-state.

A system for converting DC voltages is presented that includes a driver circuit comprising a first gate drive circuit and a second gate drive circuit, an upper circuit comprising a depletion mode transistor, and a lower circuit comprising a second depletion mode transistor. Also included is at least one gate controller, at least one coupling capacitor connected between the output of the first driver circuit and the gate of the first transistor for level shifting gate drive circuit voltages, at least one coupling capacitor connected between the output of the second driver circuit and gate of the second transistor, and a low-pass filter connected in series with a resistive load. The system operates by using the controller to alternately switch the upper and lower circuits to an on-state in response to a predetermined voltage level, wherein at least a portion of the system is integrated on a common substrate.

BRIEF DESCRIPTION OF THE DRAWINGS

Certain embodiments of the present technology are illustrated by the accompanying figures. It will be understood that the figures are not necessarily to scale and that details not necessary for an understanding of the technology or that render other details difficult to perceive may be omitted. It will be understood that the technology is not necessarily limited to the particular embodiments illustrated herein.

DETAILED DESCRIPTION

While the disclosed technology is available for embodiment in many different forms, there is shown in the drawings and will herein be described in detail several specific embodiments with the understanding that the present disclosure is to be considered as an exemplification of the principles of the technology and is not intended to limit the technology to the embodiments illustrated.

The terminology used herein is for the purpose of describing particular embodiments only and is not intended to be limiting of the present technology. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used in this specification, the terms "include," "including," "for example," "exemplary," "e.g.," and variations thereof, are not intended to be terms of limitation, but rather are intended to be followed by the words "without limitation" or by words with a similar meaning. Definitions in this specification, and all headers, titles and subtitles, are intended to be descriptive and illustrative with the goal of facilitating comprehension, but are not intended to be limiting with respect to the scope of the inventions as recited in the claims. Each such definition is intended to also capture additional equivalent items, technologies or terms that would be known or would become known to a person having ordinary skill in this art as equivalent or otherwise interchangeable with the respective item, technology or term so defined. Unless otherwise required by the context, the verb "may" indicates a possibility that the respective action, step or implementation may be performed or achieved, but is not intended to establish a requirement that such action, step or implementation must be performed or must occur, or that the respective action, step or implementation must be performed or achieved in the exact manner described.

It will be understood that like or analogous elements and/or components, referred to herein, may be identified throughout the drawings with like reference characters. It will be further understood that several of the figures are merely schematic representations of the present technology. As such, some of the components may have been distorted from their actual scale for pictorial clarity.

Figure 2:
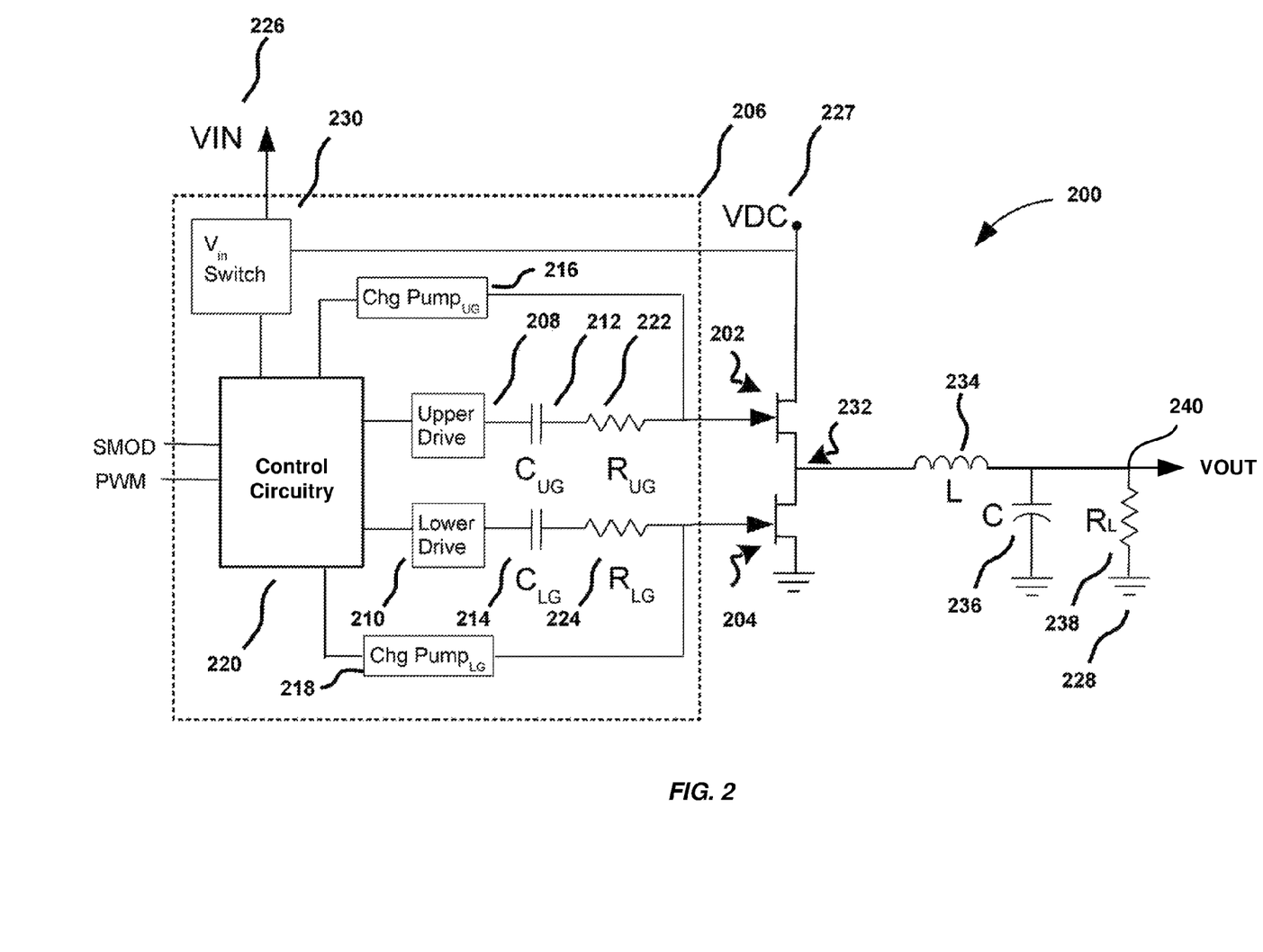
FIG. 2 illustrates a DC-DC converter power stage and output filter circuit comprising D-mode switching transistors in accordance with aspects of the technology.

FIG. 2 shows an embodiment of a single phase voltage converter power stage circuit 200. The converter power stage 200 includes a driver for driving PWM signal through a FET module assembly, comprising high-side and low-side transistor switches in a half-bridge synchronous configuration. Either E-mode or D-mode transistors may be implemented using N-channel or P-channel devices. The exemplary embodiments presented herein describe N-channel D-mode FETs. Various embodiments of FIG. 2 use multiple monolithically integrated GaAs compound semiconductor (III-V) D-mode FETs for the switches in a synchronous DC converter. A gFet™ module (see U.S. Pat. No. 8,896,034 B1) is an example of a monolithically integrated GaAs switching circuit.

In various embodiments, a single phase converter 200 includes a pair of FET switches identified as the upper (control) switch 202, and a lower (synch) switch 204, a driver 206, and a low-pass filter. The low-pass filter includes an inductor (L) 234 and a capacitor (C) 236, connected between the switching node 232 and ground 228 of the circuit. The driver 206 includes an upper gate drive circuit 208 and a lower gate drive circuit 210 connected to control circuitry 220. Also included is an upper gate coupling capacitor ($C_{UG}$) 212 connected between the output of the upper drive 208 and the gate of the upper transistor 202. A lower coupling capacitor ($C_{LG}$) 214 is connected between the output of the lower drive 210 and the gate of the lower transistor 204. The capacitors, $C_{UG}$ and $C_{LG}$, are used to level shift the driver outputs from the positive domain into a mostly negative voltage domain, necessary to control the D-mode switches. An upper gate charge pump (Chg Pump$_{UG}$) 216, and a lower gate charge pump (Chg Pump$_{LG}$) 218 are connected to the gates of the upper transistor 202 and lower transistor 204, respectively. The charge pumps 216 and 218 are designed to maintain a negative charge on the transistor gates to keep the transistors in an extended off-state when so needed. In some embodiments, the charge pump 216 and 218 may be fully integrated with the gate driver 206. An input voltage switch (VIN Switch) 230 connected between VIN 226 and the upper transistor 202 is also provided to keep current from flowing through the upper transistor prior to the charge pumps 216 and 218 being fully charged. In some embodiments, optional upper ($R_{UG}$) and lower ($R_{LG}$) gate resistors 222 and 224 are connected between $C_{UG}$ 212 and $C_{LG}$ 214 and gates of their respective transistor 202 and 204.

In various embodiments, N-channel D-mode FETs require negative voltage to switch between an on-state and an off-state. In those embodiments, $C_{UG}$ 212 and $C_{LG}$ 214 function to voltage shift the gate drive voltage into the negative domain relative to a transistor gate to source threshold voltage ($V_{gs\_th}$) using AC coupling in lieu of a negative rail.

In some embodiments, all of the driver components may be integrated on a common substrate or various discrete components may be integrated in a package. In various embodiments, the upper and lower gate drive circuits 208 and 210 include at least a portion of the control circuitry 220.

The driver 206 functions to provide switching control of the upper and lower switching transistors 202 and 204 by modulating transistor input power and gate signals. At startup, and prior to receiving PWM signals from a PWM controller, VIN may not be present, and $C_{UG}$ 212 and $C_{LG}$ 214, and charge pumps 216 and 218 may be discharged. Both $C_{UG}$ 212 and $C_{LG}$ 214, and negative charge pumps 216 and 218 must become charged to hold the FETs 202 and 204 in the off-state. The VIN Switch 230 is held off to prevent current from flowing through the upper transistor when VIN 226 is initially supplied because conduction by upper FET 202 or both FETs 202 and 204 simultaneously may overcharge the output and/or overload the circuit. The upper gate drive circuit 208 and lower gate drive circuit 210, controlled by the gate drive controller 220, each drive their respective transistor gates to control the on or off states of the transistor, thereby controlling the output at the switching node 232. In various embodiments, at startup, and with the VIN Switch 230 open, the driver control circuitry 220 issues a series of internally generated (not received from the external PWM controller) PWM signals to "exercise" (i.e. send control signals to them) the gates of the upper and lower transistors 202 and 204. Exercising the transistor gates enables quick charging of capacitors $C_{UG}$ 212 and $C_{LG}$ 214, shortening the time necessary to develop the negative charge required to turn the D-mode switches off, in preparation for closing the input switch and enabling normal operation by means of externally generated PWM signals. Switching the D-mode switches off using charge pumps alone may result in intolerable delay in enabling the circuit for normal operation. Alternatively, the charge pumps may be sized significantly larger, however, doing so may be uneconomical. Charging $C_{UG}$ 212 and $C_{LG}$ 214 by this method prepares the circuit to switch the transistors 202 and 204 on and off by voltage level shifting incoming PWM signals and also allows for turning on the VIN switch. When the charge pumps 216 and 218 are enabled, they work to maintain the negative charge across capacitors $C_{UG}$ 212 and $C_{LG}$ 214 and keep transistors 202 and 204 in an off-state until controlling PWM control signals are received. Keeping the transistors 202 and 204 off renders the circuit available for receiving externally generated PWM signals. The AC coupling capacitors $C_{UG}$ 212 and $C_{LG}$ 214 operate to level shift the drive circuit's Pulse Width Modulation (PWM) outputs to a range of voltages that comply with the corresponding FET switch's gate to source threshold voltage ($V_{gs\_th}$), directing the transistor into an off-state or on-state. Resistors $R_{UG}$ 222 and $R_{LG}$ 224 may optionally be placed between the $C_{UG}$ 212 and $C_{LG}$ 214, and the corresponding gate input of the transistors 202, and 204, to reduce the occurrence of circuit oscillations. These oscillations may occur due to high series parasitic inductance, for example. For example, a typical N-channel D-mode transistor may have a switching threshold of –0.8 Volts. Voltages below the threshold voltage keep the transistor switched off, and voltages above the threshold allow current flow through the transistor. A voltage rail that supplies zero to five (5) volts, for example, is incapable of turning off the transistor, while a properly selected AC coupling capacitor may shift the normally 0 to 5 volt gate-to-source voltage ($V_{GS}$) of a PWM control signal to a –4.5 V to 0.5 Volt range. This shifted voltage range corresponds with voltages above and below the switching threshold ($V_{gs\_th}$). A voltage VIN 226 is present, and after transistors 202 and 204 are both driven into an off-state, VIN Switch 230 is closed applying voltage to power the upper transistor 202. Of note is that VIN Switch 230 disconnects VIN 226 from the D-mode switches when it cannot be ensured that the gate drive controller 220 can keep the power switches off or when a fault occurs in a circuit component such that normal operation must be suspended. The charge pumps 216 and 218 continue to maintain the voltage more negative than the threshold, $V_{gs\_th}$, after the VIN Switch 230 is closed to keep transistors 202 and 204 in the off-state. For example, the charge pumps 216 and 218 maintain a voltage more negative than (lower than) $V_{gs\_th}$, when paired with N-channel D-mode transistors 202 and 204. Thereafter, the charge pumps 216 and 218 may be disabled and incoming PWM control signals may be permitted to modulate the voltage output from the transistor pair 202 and 204 by alternately switching the transistors 202 and 204 on and off according to the duty cycle imposed on the PWM signal. Operation with a normal, periodic PWM input recharges the coupling capacitors 212 and 214, maintaining proper operational negative bias. An output received at the switching node 232 may be low-pass filtered through inductor (L) 234, and a capacitor (C) 236 to produce an output voltage (VOUT) 240 exhibiting minimal ripple across a load, $R_{load}$ 238.

The following equation approximates a minimum value for determining a capacitance value for a coupling capacitor (AC drive capacitor, e.g. coupling capacitor 212 and/or 214) used for voltage shifting a gate drive output.

$$C_{ac\_drive} = \frac{Q_{g\_FET}}{V_{drive} - R_{out\_driver} \cdot Q_{g\_FET} \cdot 1/d \cdot F_{SW} \cdot 10^{-3} - V_f + V_{off}}$$

Where:

$C_{ac\_drive}$ is a series AC drive capacitor value in nano-Farads (nF)

$Q_{g\_FET}$ is a total gate charge of a FET power transistor being driven, as measured by sweeping a gate-source voltage from $V_f$ to $V_{off}$ in a circuit of interest, in nano-Coulombs (nC)

$V_{drive}$ is a magnitude of the gate drive output voltage excursion in Volts (V)

$R_{out\_drive}$ is the gate drive's output impedance in Ohms (Ω)

d is the duty cycle of the FET power transistor being driven, expressed as a number between 0 and 1

$F_{sw}$ is a switching frequency of the power transistor in megahertz (MHz)

$V_f$ is a forward gate-source junction voltage of the power transistor in the ON state, in Volts (this is a positive number)

$V_{off}$ is a desired reverse bias gate-source junction voltage of the power transistor in the OFF state, in Volts (this is a negative number)

The equation shown above may not account for the gate leakage that D-mode transistors may exhibit in the OFF state. In addition, the $R_{out\_drive}$ term in the denominator may be merely an approximation. Increased accuracy may be obtained with an equation that considers additional parameters. A value that is a few times larger than the minimum necessary value may provide sufficient margin for tolerances and variety in operating conditions.

Figure 3:
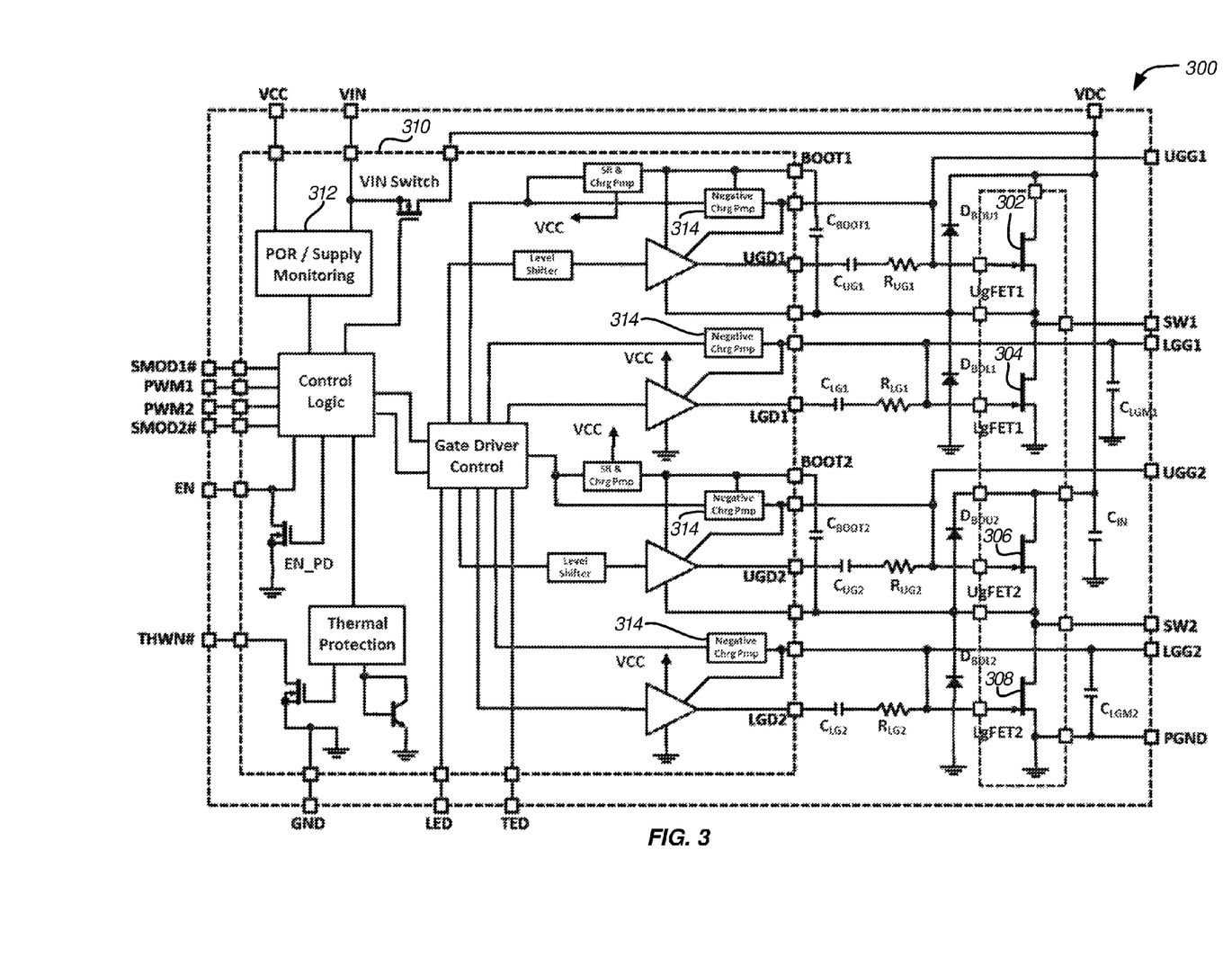
FIG. 3 illustrates a dual phase DC-DC converter power stage circuit comprising D-mode switching transistors in accordance with aspects of the technology.

FIG. 3 is a circuit schematic that illustrates an example of a Dual Phase Power Stage circuit 300 for application with D-mode FETs. The dual phase power stage circuit 300 includes a first FET pair comprising upper UgFET1 302 and lower LgFET1 304. The dual phase power stage circuit 300 includes a second FET pair comprising upper UgFET2 306 and lower LgFET2 308. A dual phase driver 310 controls the output of gate signals to the gates of the FET transistors, UgFET1 302, LgFET1 304, UgFET2 306, and LgFET2 308. The dual phase driver 310 outputs may be level shifted using coupling capacitors CUG1, CLG1, CUG2, and CLG2 before being applied to the gates of the respective transistors UgFET1 302, LgFET1 304, UgFET2 306, and LgFET2 308. An output from the FET1 pair (UgFET1 302, LgFET1 304) is applied at terminal SW1. An output from the FET2 pair (UgFET2 306, LgFET2 308) is applied at terminal SW2. The outputs at SW1 and SW2 may be connected to low-pass filters with the voltage applied across one or more resistive loads. Negative Charge Pumps 314 are included to maintain the D-mode FETs off during tri-state, when the FET half-bridge switch circuit (e.g. upper FET1, lower FET1) is not switching and the VIN switch is closed or prior to its closure. The Dual Phase Power Stage circuit 300 includes additional components such as input power supplies monitors and thermal protection circuitry, as described below.

In some embodiments, prior to startup, VCC and VIN may not initially be present, and the coupling capacitors CUG1, CLG1, CUG2, and CLG2 may be discharged. The coupling capacitors $C_{UGx}$ and $C_{LGx}$ become charged when the gates of the switching transistors UgFET1 302, LgFET1 304, UgFET2 306, LgFET2 308 are exercised by the internally generated PWM pulses and the negative charge pumps 314 are enabled to hold the SW nodes in tristate, where both the upper and lower FETs are held in the off-state. When operational, the negative charge pumps 314 may not develop the same negative voltage amplitude across the coupling capacitors CUG1, CLG1, CUG2, and CLG2 as the negative voltage amplitude created by the passing of PWM pulses through the switching transistors UgFET1 302, LgFET1 304, UgFET2 306, LgFET2 308, but it is understood that the amplitude of the voltage developed is sufficiently negative to keep the switching transistors in an off state.

Figure 4A:
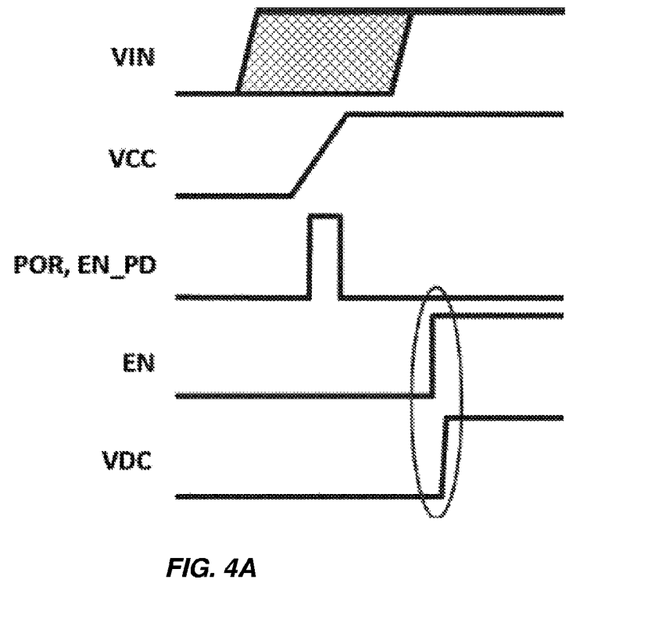
FIG. 4A is an exemplary timing diagram that illustrates a start-up sequence in accordance with aspects of the technology.
Figure 4B:
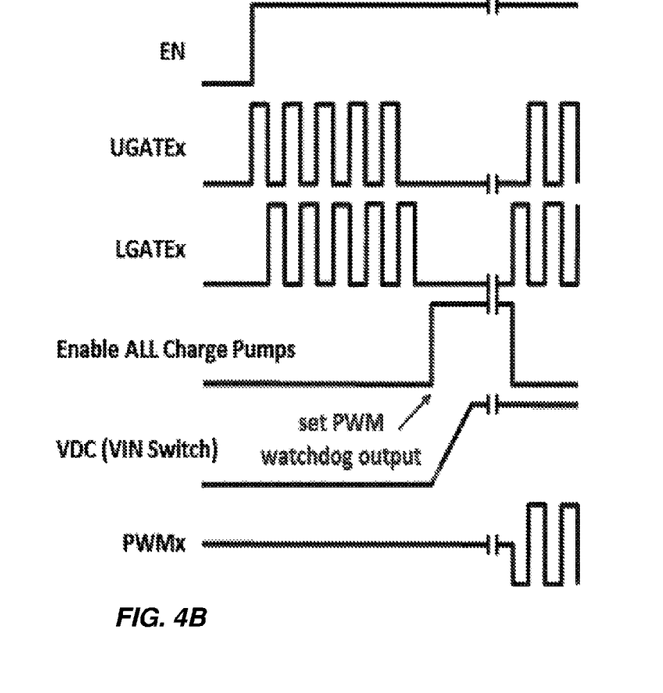
FIG. 4B is an exemplary timing diagram that illustrates finer details of start-up sequence 4A in accordance with aspects of the technology.

FIG. 4A is an exemplary timing diagram that illustrates a start-up sequence in accordance with aspects of the technology. FIG. 4B is an exemplary timing diagram that illustrates additional details of the start-up sequence of FIG. 4A, in accordance with aspects of the technology. The timing diagram illustrated in FIG. 4A shows a start-up sequence for the converter power stage displayed in FIG. 3 after initiating voltage at the bias supply voltage, VCC, and the power supply voltage, VIN. Once the power supply monitor circuit 312 senses that VCC and VIN thresholds have been exceeded, and power-on-resets are released, the control circuitry waits for an EN high signal from one or multiple external components. In the case of multiple EN signals, they are typically logically tied together. Power-on-reset is a signal that is generated by specially designed circuitry as the bias supply comes up into operational range, and is a signal that is used to reset all logic gates to a known, predictable state. Power-on-reset function is well understood by those skilled in the art.

Referring to FIG. 4A and FIG. 4B, the EN signal, circled in FIG. 4A triggers internal control logic to generate a series of 'dummy' PWM cycles, which propagate to the UGATEx and LGATEx outputs in the timing diagram shown in FIG. 4B, where 'x' corresponds to a number of the target FET pair (e.g., UgFET1 302, LgFET1 304, UgFET2 306, LgFET2 308). These cycles are referred to as "dummy" cycles because they are internally generated (not received from the external PWM controller) and they are used to quickly charge up the coupling capacitors (e.g., CUG1, CLG1, CUG2, CLG2) and are not intended to regulate an output voltage. The 'dummy' cycles exercise the FET gates, causing charging of the coupling capacitors CUG1, CLG1, CUG2, CLG2 which then allow the switching transistors to be held off and the input switch to be turned on. A number of 'dummy' PWM cycles that may be propagated may vary with the design of the converter components. In various embodiments, the cycle count is 1, 2, 4, 10, 20, 50, or more cycles. A typical count may be 16 cycles. Once these cycles have completed, FIG. 4B illustrates the negative charge pumps 314 being enabled to maintain the D-mode FETs in an off-state (tristate) until the VIN switch is turned on and externally generated PWM signals are permitted to control switch operation. See FIG. 4B timing diagram as an illustration of the start-up sequence. The described components and their operation embody a dual path gate drive; an AC-coupled path for high speed switching, and a second DC path for maintaining off-state gate bias.

A timer may be used to allow sufficient delay for the input switch, VIN Switch, to turn on. The VIN switch's turn-on is controlled, occurring gradually to avoid high inrush currents from developing, as indicated by the slope in the wave pattern associated with the VDC 227 (VIN switch output). When the VIN switch timer expires, the control circuitry allows externally generated voltage control signals, PWMx, to propagate through the Control Logic to the Gate Driver Control circuit. PWM signals are propagated to the upper and lower gate drives to control the on or off states of the FETs of the half bridge switch configuration, thereby regulating the converter output.

In various embodiments, while receiving PWM signals to control the half-bridge circuit, a watchdog timer may detect an absence of PWM signals for a predetermined period. Since the operation under PWM signals recharges the gate capacitors, and since the gates of the FETs leak charge commensurate to the voltages applied to their terminals, the depletion of these capacitors (CUG1, CLG1, CUG2, CLG2) may allow the D-mode devices to inadvertently switch to an unintended state. For example, a D-mode n-channel FET may inadvertently turn-on when the capacitor charge is depleted.

Figure 5:
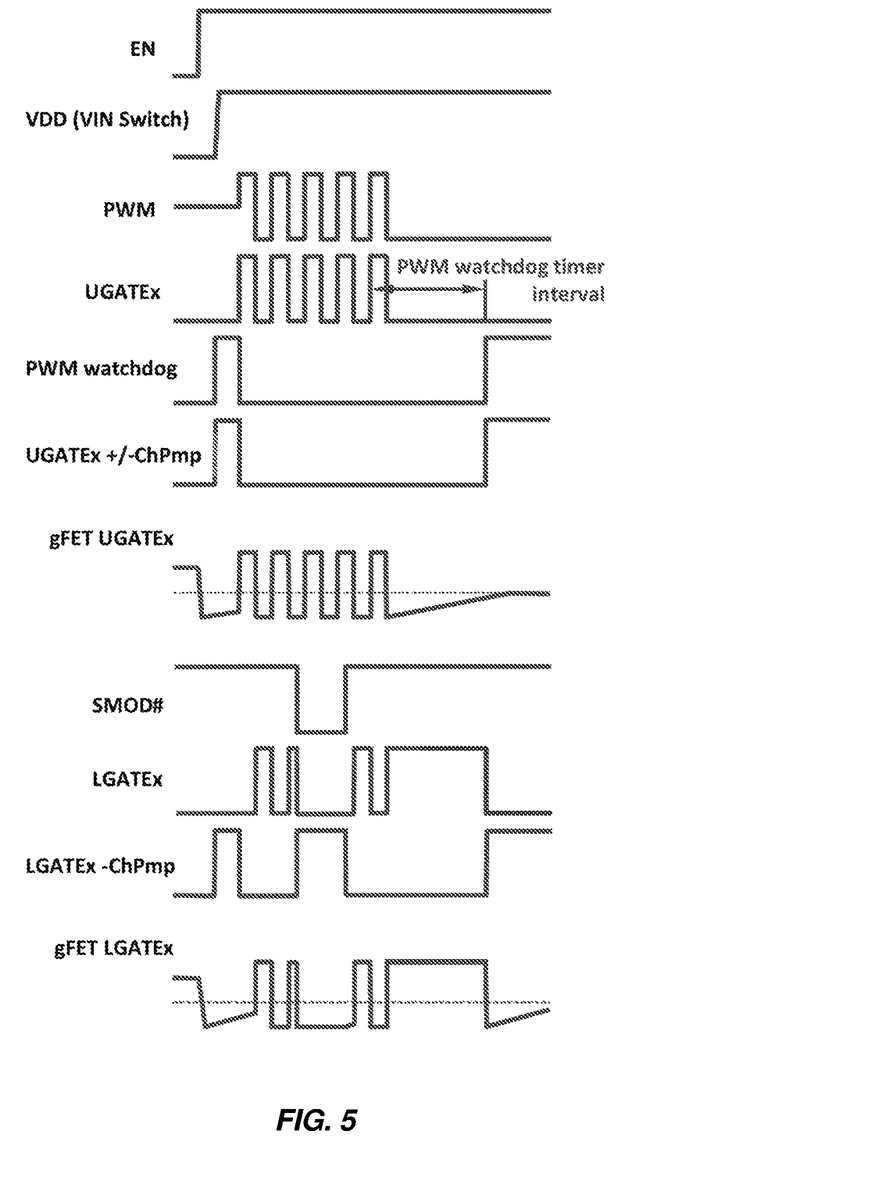
FIG. 5 is an exemplary timing diagram that illustrates PWM and SMOD signal processing in accordance with aspects of the technology.

FIG. 5 is an example timing diagram that illustrates the response of the circuit of FIG. 3 to changes in PWM and SMOD input signals. The driver outputs follow the PWM input signal, where a PWM high turns on the upper FET switch and a PWM low turns on the lower FET switch. A tri-stated PWM keeps both upper and lower transistor switches off.

As shown in FIG. 5, activity of the watchdog timer in response to the absence of a low-to-high PWM transition over a pre-determined time interval causes the PWM watchdog signal to go high, and the control circuitry to enable the upper negative charge pumps. Somewhat similarly, SMOD# assertion, asynchronous to PWM operation, turns off the lower power switch driver and enables the respective phase's lower negative charge pump (when there is one SMOD# input per phase).

In some embodiments, the gate driver circuit shown in FIG. 3 may be integrated on the same semiconductor substrate with the FET transistors of the half-bridge circuit when compatible materials and fabrication processes are used. For example, a GaAs-based driver or a smaller subsection of it may be integrated with GaAs-based upper/lower transistors (e.g., UgFET1 302, LgFET1 304, UgFET2 306, LgFET2 308) on the same substrate. In other situations where materials and fabrication techniques are inadequate for full integration, package level integration may suffice. In some embodiments a hybrid integrated circuit (HIC) may be formed, wherein a portion of the components are integrated on a single substrate, and the remaining portion of components are integrated at the package level (e.g. on a common substrate). For example, integrating a Si FET driver matched with GaAs-based Upper/Lower FETs may be accomplished at the package level.

In some embodiments, an asynchronous converter may be emulated using the gate drive controller to control the state of the lower transistor (e.g., LgFET1 304, LgFET2 308) in response to a skip mode input signal, SMOD. In these embodiments, activating SMOD turns off the lower gate drive output, keeping the lower device off while SMOD is active. Any positive inductor current passes through a lower integrated freewheeling Schottky diode. The circuit layout of FIG. 3 illustrates freewheeling Schottky diodes $D_{BDL1}$ and $D_{BDL2}$. This may be different from true zero-crossing diode emulation, which is a mode of low-current operation. In order to keep the lower devices (e.g., LgFET1 304, LgFET2 308) off for extended periods of time, the lower drivers' negative charge pumps are made active while SMOD is asserted.

FIG. 3 also illustrates two pairs of half-bridge converters (i.e., UgFET1 302 paired with LgFET1 304, and UgFET2 306 paired with LgFET2 308) that can be applied to two separate output voltage domains. Various other embodiments may include additional pairs of half-bridge converter circuits that can be used to add additional phases. The additional half-bridge circuits may be embodied separately or integrated.

The above description is illustrative and not restrictive. This patent describes in detail various embodiments and implementations of the present invention and the present invention is open to additional embodiments and implementations, further modifications, and alternative constructions. There is no intention in this patent to limit the invention to the particular embodiments and implementations disclosed; on the contrary, this patent is intended to cover all modifications, equivalents and alternative embodiments and implementations that fall within the scope of the claims. Moreover, embodiments illustrated in the figures may be used in various combinations. Any limitations of the invention should, therefore, be determined not with reference to the above description, but instead should be determined with reference to the appended claims along with their full scope of equivalents.

What is claimed is:

1. A driver circuit comprising:
   at least one gate drive circuit to control a depletion or low-threshold enhancement mode compound semiconductor (III-V) switching transistor;
   at least one charge pump to maintain a voltage that holds the transistor in an off-state; and
   at least one coupling capacitor electrically connected between the output of each of the at least one gate drive circuit and a gate of the transistor, to shift a gate voltage that alternately drives the transistor into an on-state and an off-state.

2. The driver circuit of claim 1, further comprising at least one gate drive circuit controller electrically coupled to the at least one FET gate.

3. The driver circuit of claim 1, wherein a gate voltage surpassing a threshold voltage drives the transistor to an off-state.

4. The driver circuit of claim 1, further comprising a first compound semiconductor (III-V) switching transistor coupled with a first gate drive circuit electrically connected to a second compound semiconductor (III-V) switching transistor coupled with a second gate drive circuit to provide synchronous operation of a DC-DC converter.

5. The driver circuit of claim 2, wherein the at least one controlling circuit synthesizes a series of Pulse Width Modulation (PWM) signals to activate the at least one gate drive circuit to quickly charge at least one coupling capacitor.

6. The driver circuit of claim 3, further comprising an input power isolating switch to isolate an input voltage from at least one depletion mode (or low threshold enhancement mode) compound semiconductor (III-V) switching transistor prior to charging at least one coupling capacitor and the at least one charge pump.

7. The driver circuit of claim 6, wherein the at least one charge pump supplies a voltage to the gate of the depletion mode compound semiconductor (III-V) transistor surpassing the threshold voltage when the input power isolating switch is in an on-state, to maintain the depletion mode compound semiconductor (III-V) transistor in an off-state.

8. The driver circuit of claim 1, wherein at least one charge pump is integrated in the same die with at least one gate drive.

9. The driver circuit of claim 1, wherein at least one coupling capacitor provides an AC-coupled gate drive circuit for high-speed switching, and at least one charge pump provides a DC voltage for maintaining off-state bias.

10. The driver circuit of claim 1, further comprising a Watchdog protocol to monitor the occurrence and timing of recharge signals for recharging at least one coupling capacitor.

11. The driver circuit of claim 1, further comprising an enable (EN) signal for coordinating start-up and shut-down operations with a PWM controller and any optionally connected parallel power stage.

12. A method for driving a depletion-mode compound semiconductor (III-V) transistor in a DC-DC converter, the method comprising:
   initializing a signal to initiate a startup condition;
   switching a power isolating switch to an on-state; and
   initiating at least one command to control a driver circuit to pass an external controller-generated PWM control signal to a gate of the compound semiconductor (III-V) transistor, wherein the control signal alternately drives the transistor to an on-state and an off-state.

13. The method of claim 12, wherein the startup condition comprises:
   switching the input power isolating switch to an off-state;
   switching a driver enablement signal to an on-state;
   generating a predetermined sequence of an internal controller-generated PWM control signal to charge at least one driver circuit capacitor to a voltage exceeding the threshold voltage to drive the compound semiconductor (III-V) transistor to an off-state; and
   controlling at least one charge pump to maintain a voltage exceeding the threshold voltage necessary to hold the said transistor in the off-state.

14. The method of claim 13, further comprising voltage level shifting a gate voltage for driving the compound semiconductor (III-V) transistor alternately to an on-state and an off-state using at least one coupling capacitor.

15. A system for converting DC voltages comprising:
   a driver circuit comprising a first gate drive circuit and a second gate drive circuit;
   an upper circuit comprising a depletion mode compound semiconductor (III-V) transistor;
   a lower circuit comprising a second depletion mode compound semiconductor (III-V) transistor;

at least one gate controller;

at least one coupling capacitor connected between the output of the first driver circuit and the gate of the first compound semiconductor (III-V) transistor for level shifting gate drive circuit voltages;

at least one coupling capacitor connected between the output of the second driver circuit and gate of the second compound semiconductor (III-V) transistor; and a low-pass filter connected in series with a resistive load, wherein the controller alternately switches the upper and lower circuits to an on-state in response to a predetermined voltage level, wherein at least a portion of the system is integrated on a common substrate.

16. The system of claim 15, wherein the controller monitors the charge on at least one coupling capacitor for a low-to-high PWM transition within a predetermined interval, and the controller controls at least one charge pump to replenish the charge on the at least one coupling capacitor in the absence of the PWM transition.

17. The system of claim 15, further comprising an enable (EN) signal for coordinating start-up and shut-down operations with a PWM controller and any optionally connected parallel power stage or multitude thereof.

18. The system of claim 15, wherein at least a portion of the system comprises a hybrid integrated circuit (HIC).

* * * * *